United States Patent
Takashima et al.

(10) Patent No.: US 10,410,877 B2
(45) Date of Patent: Sep. 10, 2019

(54) ETCHING METHOD

(71) Applicant: Tokyo Electron Limited, Tokyo (JP)

(72) Inventors: Ryuichi Takashima, Miyagi (JP); Taku Gohira, Miyagi (JP); Yoshinobu Ooya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/378,167

(22) Filed: Dec. 14, 2016

(65) Prior Publication Data

US 2017/0178922 A1 Jun. 22, 2017

(30) Foreign Application Priority Data

Dec. 22, 2015 (JP) ................. 2015-250060

(51) Int. Cl.
*H01L 21/311* (2006.01)
*H01L 21/3065* (2006.01)
*H01J 37/32* (2006.01)

(52) U.S. Cl.
CPC .. *H01L 21/31116* (2013.01); *H01J 37/32009* (2013.01); *H01J 37/32165* (2013.01); *H01L 21/31144* (2013.01); *H01J 2237/334* (2013.01)

(58) Field of Classification Search
CPC ........... H01L 21/31116; H01L 21/3065; H01L 21/31144; H01J 37/32165; H01J 37/32009; H01J 2237/334
See application file for complete search history.

(56) References Cited

U.S. PATENT DOCUMENTS

| | | | | |
|---|---|---|---|---|
| 5,362,361 A * | 11/1994 | Tatsumi | ............. | H01L 21/3065 216/67 |
| 2001/0005634 A1* | 6/2001 | Kajiwara | .......... | H01L 21/31116 438/706 |
| 2003/0019842 A1* | 1/2003 | Hineman | .......... | H01J 37/32623 216/72 |
| 2004/0248413 A1* | 12/2004 | Donohoe | ............... | C09K 13/08 438/689 |
| 2013/0105947 A1* | 5/2013 | Fuller | ............... | H01L 21/76898 257/618 |
| 2015/0034592 A1* | 2/2015 | Huff | ..................... | H01J 37/3211 216/41 |

FOREIGN PATENT DOCUMENTS

| | | |
|---|---|---|
| CN | 101124661 | 2/2008 |
| JP | 2015-153941 | 8/2015 |
| JP | 2015-159308 | 9/2015 |
| WO | 2005/112092 | 11/2005 |

* cited by examiner

*Primary Examiner* — Binh X Tran
*Assistant Examiner* — Mahmoud Dahimene
(74) *Attorney, Agent, or Firm* — IPUSA, PLLC

(57) ABSTRACT

An etching method for etching a silicon oxide film is provided that includes generating a plasma from a gas including a hydrogen-containing gas and a fluorine-containing gas using a high frequency power for plasma generation, and etching the silicon oxide film using the generated plasma. The fluorine-containing gas includes a hydrofluorocarbon gas, and the sticking coefficient of radicals generated from the hydrofluorocarbon gas is higher than the sticking coefficient of radicals generated from carbon tetrafluoride ($CF_4$).

15 Claims, 10 Drawing Sheets

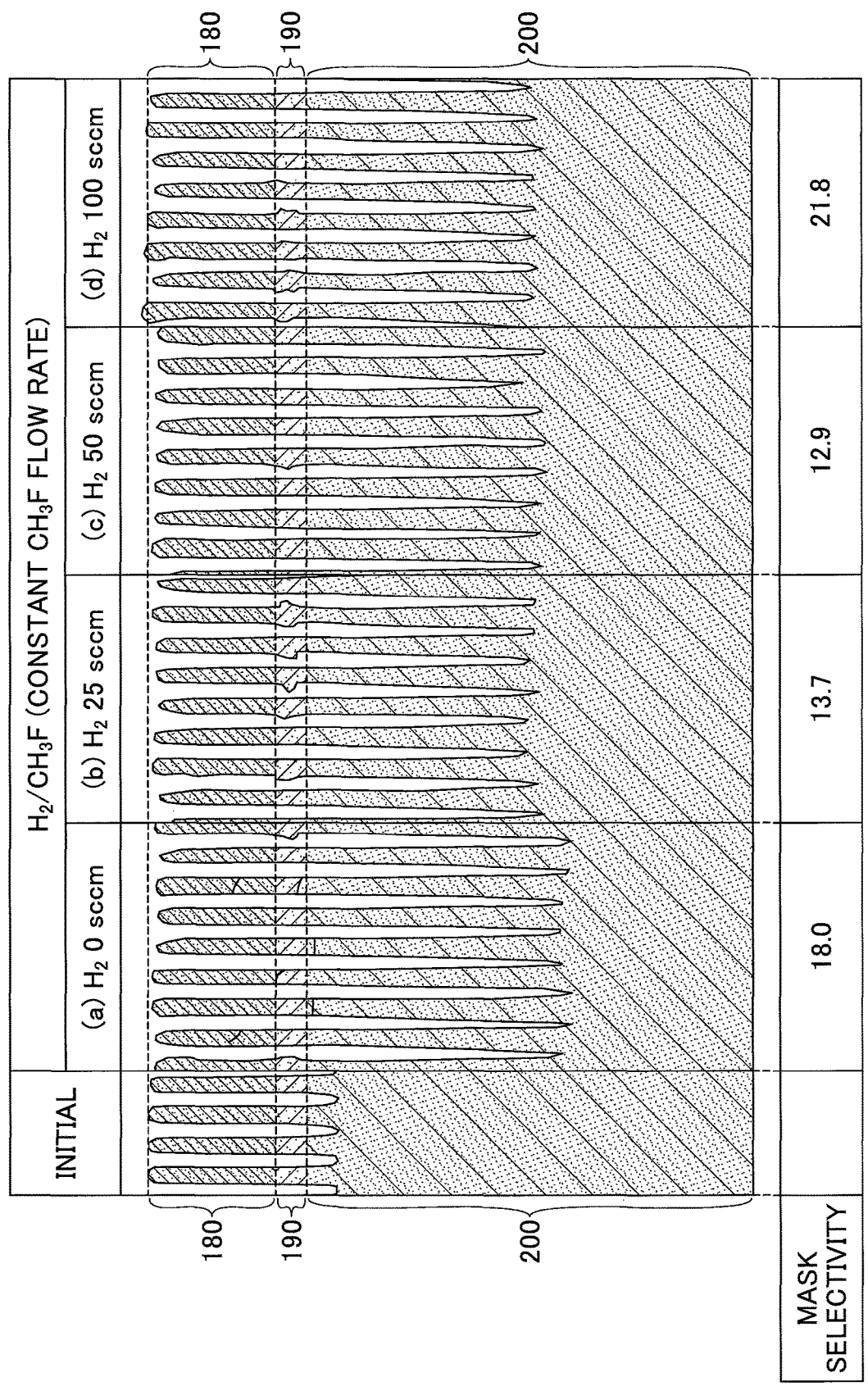

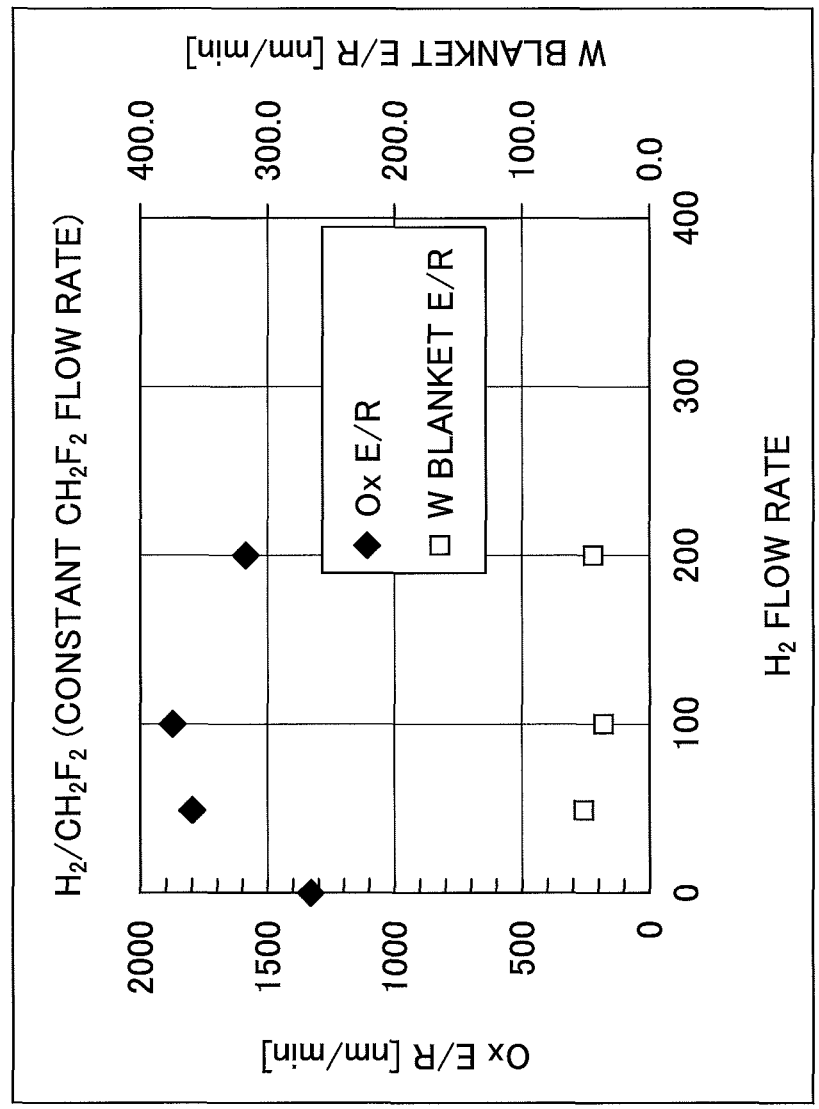

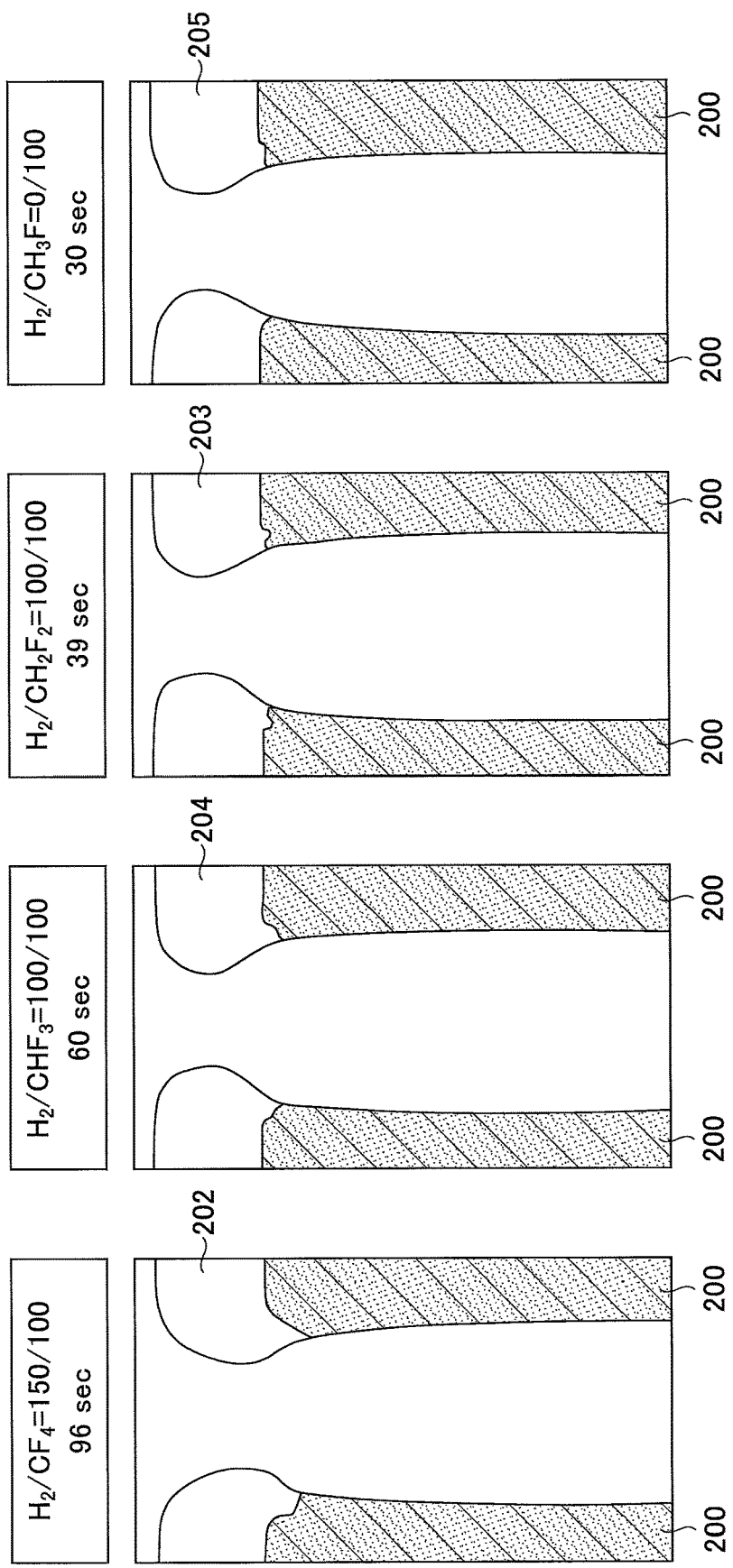

ETCHING METHOD

CROSS-REFERENCE TO RELATED APPLICATION

The present application is based on and claims the benefit of priority to Japanese Patent Application No. 2015-250060 filed on Dec. 22, 2015, the entire contents of which are hereby incorporated by reference.

BACKGROUND OF THE INVENTION

1. Field of the Invention
The present invention relates to an etching method.
2. Description of the Related Art
Etching methods for etching a silicon oxide film using an etching gas including $CH_2F_2$ gas at low temperatures are known (e.g., see Japanese Unexamined Patent Publication No. 2015-159308). Japanese Unexamined Patent Publication No. 2015-159308 describes an etching gas for forming a contact hole pattern having a high aspect ratio.

Also, an etching method is known that involves exciting a gas containing hydrogen gas, hydrogen bromide gas, nitrogen trifluoride gas, and at least one of hydrocarbon gas, fluorocarbon gas, and hydrofluorocarbon gas, and etching a multilayer film in the layering direction from its surface down to a midpoint position to form a hole in the multilayer film (e.g., see Japanese Unexamined Patent Publication No. 2015-153941).

However, the above-described techniques do not address controlling where reaction products generated during plasma etching are to be deposited on a mask film through selection of the appropriate combination of gases. Thus, according to the above-described techniques, it is difficult to the control the position where reaction products are to be deposited on the mask film by controlling a gas to be added to the etching gas.

SUMMARY OF THE INVENTION

In view of the above-problems of the related art, one aspect of the present invention is directed to providing an etching method that enables etching while adjusting the profile of an opening formed in a mask film.

According to one embodiment of the present invention, an etching method for etching a silicon oxide film is provided that includes generating a plasma from a gas including a hydrogen-containing gas and a fluorine-containing gas using a high frequency power for plasma generation, and etching the silicon oxide film using the generated plasma. The fluorine-containing gas includes a hydrofluorocarbon gas, and the sticking coefficient of radicals generated from the hydrofluorocarbon gas is higher than the sticking coefficient of radicals generated from carbon tetrafluoride ($CF_4$).

BRIEF DESCRIPTION OF THE DRAWINGS

FIG. 5 is a diagram showing example etching results of etching the silicon oxide film using $H_2$ gas and $CH_3F$ gas according to an embodiment of the present invention;
FIGS. 6A and 6B are graphs indicating etch rates of the silicon oxide film and a mask film when the flow rate of $CF_4$ gas or $CH_2F_2$ gas is controlled to be constant and the flow rate of $H_2$ gas is varied according to an embodiment of the present invention;
FIGS. 8A-8D are diagrams showing example profiles of deposited reaction products for controlling the profile of an opening formed by an etching method according to an embodiment of the present invention.

DESCRIPTION OF THE PREFERRED EMBODIMENTS

Figure 1:
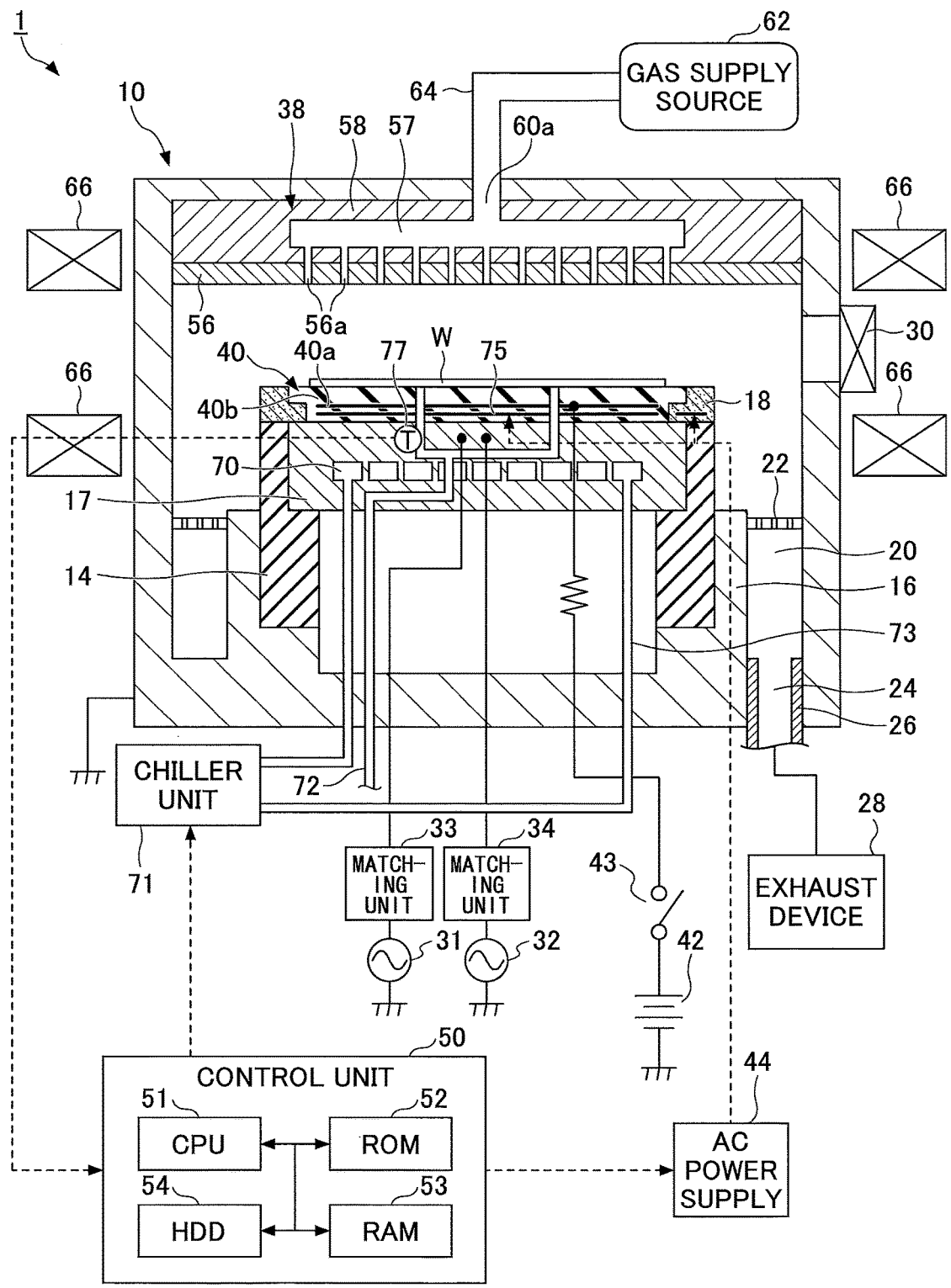
FIG. 1 is a cross-sectional view of an etching apparatus according to an embodiment of the present invention.

In the following, embodiments of the present invention will be described with reference to the accompanying drawings. Note that elements illustrated in the drawings and described below that have substantially the same functions and/or features are given the same reference numerals and overlapping descriptions thereof may be omitted.

[Overall Configuration of Etching Apparatus]

First, the overall configuration of an etching apparatus 1 according to an embodiment of the present invention will be described. FIG. 1 is a cross-sectional view of the etching apparatus 1 according to the present embodiment.

The etching apparatus 1 includes a cylindrical processing chamber 10 made of aluminum having an alumite-treated (anodized) surface, for example. The processing chamber 10 is grounded.

A mounting table 17 is arranged within the processing chamber 10. The mounting table 17 may be made of aluminum (Al), titanium (Ti), or silicon carbide (SiC), for example, and is supported on a support 16 via an insulating cylindrical holder 14. In this way, the mounting table 17 is arranged at a bottom portion of the processing chamber 10.

An exhaust pipe 26 is arranged at the bottom portion of the processing chamber 10 and is connected to an exhaust device 28. The exhaust device 28 may include a vacuum pump, such as a turbo-molecular pump or a dry pump (not shown). The exhaust device 28 is configured to depressurize a processing space within the processing chamber 10 to a predetermined vacuum level and direct gas within the processing chamber 10 towards an exhaust path 20 and an exhaust port 24 to discharge the gas. A baffle plate 22 for controlling the gas flow is arranged in the exhaust path 20.

A gate valve 30 is arranged at a side wall of the processing chamber 10. A wafer W may be loaded into or unloaded from the processing chamber 10 by opening/closing the gate valve 30.

A first high frequency power supply 31 for generating plasma is connected to the mounting table 17 via a matching unit 33, and a second high frequency power supply 32 for drawing ions from within the plasma onto the wafer W is connected to the mounting table 17 via a matching unit 34. For example, the first high frequency power supply 31 may be configured to apply to the mounting table 17, a first high frequency power HF (high frequency power for plasma generation) with a first frequency (e.g., 60 MHz) that is suitable for generating a plasma within the processing chamber 10. The second high frequency power supply 32 may be configured to apply to the mounting table 17, a second high frequency power LF (high frequency power for biasing) with a second frequency (e.g. 13.56 MHz) that is lower than the first frequency and is suitable for drawing ions from the plasma onto the wafer W placed on the mounting table 17. In this way, the mounting table 17 supports the wafer W and also acts as a lower electrode.

An electrostatic chuck 40 configured to hold the wafer W by an electrostatic attractive force is provided on a top surface of the mounting table 17. The electrostatic chuck 40 includes an electrode 40*a* that is made of a conductive film and is arranged between a pair of insulating layers 40*b* (or insulating sheets). A DC voltage supply 42 is connected to the electrode 40*a* via a switch 43. The electrostatic chuck 40 electrostatically attracts and holds the wafer W by a Coulomb force that is generated when a voltage is applied thereto from the DC voltage supply 42. A temperature sensor 77 that detects the temperature of the electrostatic chuck 40 is arranged at the electrostatic chuck 40. In this way, the temperature of the electrostatic chuck 40 may be measured.

A focus ring 18 is arranged at the outer edge of the electrostatic chuck 40 to surround the mounting table 17. The focus ring 18 may be made of silicon or quartz, for example. The focus ring 18 is provided to improve in-plane etching uniformity.

A gas shower head 38 is arranged at a ceiling portion of the processing chamber 10. The gas shower head 38 acts as an upper electrode at a ground potential. In this way, the first high frequency power from the first high frequency power supply 31 is capacitively applied between the mounting table 17 and the gas shower head 38.

The gas shower head 38 includes an electrode plate 56 having multiple gas holes 56*a* and an electrode support 58 configured to detachably hold the electrode plate 56. A gas supply source 62 is configured to supply processing gas to the gas shower head 38 from a gas inlet 60*a* via a gas supply pipe 64. The processing gas supplied to the gas shower head 38 is diffused at a gas diffusion chamber 57 to be introduced into the processing chamber 10 from the multiple gas holes 56*a*. A magnet 66 is arranged to extend annularly or concentrically around the processing chamber 10 so that the plasma generated within a plasma generation space of the processing chamber 10 may be controlled by the magnetic force of the magnet 66.

A heater 75 is embedded within the electrostatic chuck 40. Note that in some embodiments, the heater 75 may be attached to a backside face of the electrostatic chuck 40 instead of being embedded within the electrostatic chuck 40, for example. A current output by an AC power supply 44 is supplied to the heater 75 via a feeder. In this way, the heater 75 may be able to heat the mounting table 17.

A coolant path 70 is formed within the mounting table 17. A coolant (hereinafter also referred to as "brine") supplied from a chiller unit 71 may be circulated through the coolant path 70 and coolant circulation pipes 73 to thereby cool the mounting table 17.

With the above-described configuration, the mounting table 17 may be heated by the heater 75 and cooled by the brine that is adjusted to a predetermined temperature and is circulated through the coolant path 70 within the mounting table 17. In this way, the temperature of the wafer W may be adjusted to a desired temperature. Also, a heat transfer gas such as helium (He) is supplied between the backside surface of the wafer W and the top surface of the electrostatic chuck 40 through a heat transfer gas supply line 72.

A control unit 50 is configured to control the individual components of the etching apparatus 1, such as the exhaust device 28, the AC power supply 44, the DC voltage supply 42, the switch 43 for the electrostatic chuck, the first high frequency power supply 31, the second high frequency power supply 32, the matching units 33 and 34, a heat transfer gas supply source (not shown), the gas supply source 62, and the chiller unit 71. The control unit 50 also acquires a sensor temperature detected by a temperature sensor 77 attached to the backside surface of the heater 75. Note that the control unit 50 may be connected to a host computer (not shown).

The control unit 50 includes a CPU (Central Processing Unit) 51, a ROM (Read Only Memory) 52, a RAM (Random Access Memory) 53, and an HDD (Hard Disk Drive) 54. The CPU 51 executes a plasma process, such as etching, according to various recipes stored in a storage unit that may be implemented by the ROM 52, the RAM 53, or the HDD 54, for example. Note that the storage unit also stores various types of data, such as a data table (described below). The control unit 50 is configured to control the temperatures of a heating mechanism implemented by the heater 75 and a cooling mechanism implemented by brine, for example.

When performing an etching process using a plasma generated by the etching apparatus 1 having the above-described configuration, the gate valve 30 is opened, and a wafer W is loaded into the processing chamber 10 and placed on the electrostatic chuck 40. After the wafer W is loaded, the gate valve 30 is closed. Then, the internal pressure of the processing chamber 10 is reduced to a predetermined pressure by the exhaust device 28. Then, a voltage from the DC voltage supply 42 is applied to the electrode 40*a* of the electrostatic chuck 40 so that the wafer W may be electrostatically attracted to the electrostatic chuck 40.

Then, a predetermined gas is introduced into the processing chamber 10 from the shower head 38, and the first high frequency power HF for plasma generation with a predetermined power is applied to the mounting table 17. The first high frequency power HF causes ionization and dissociation of the gas that has been introduced into the processing chamber 10 to thereby cause plasma generation within the processing chamber 10. The wafer W is etched by ions and radicals included in the generated plasma. Also, the second high frequency power LF for biasing may be applied to the mounting table 17 in order to draw ions in the plasma towards the wafer W. After the plasma etching is completed, the wafer W is unloaded from the processing chamber 10.

[Etching Method]

In the following, an etching method for etching a wafer W using the etching apparatus 1 having the above-described configuration according to one embodiment of the present invention is described with reference to FIGS. 2-5. Note that an initial state of a layered film is shown at the leftmost side of FIGS. 2-5. Specifically, a silicon oxide ($SiO_2$) film 200, a silicon nitride (SiN) film 190, and a polysilicon mask film 180 are stacked on the wafer W to form the layered film subject to etching. Note that when the etch rate (hereinafter also referred to as "E/R") of the silicon oxide film 200 increases, the etch rate of the mask film 180 decreases relative to the etch rate of the silicon oxide film 200 such that a hole with a high aspect ratio may be formed in the silicon oxide film 200. In this case, the etching profile can be adjusted to a desired profile by controlling the profile of the mask film 180.

Thus, in an etching method according to an embodiment of the present invention, etching is performed while adjusting the profile of an opening formed in the mask film 180. At this time, the temperature of the chiller (chiller unit) is set to −60° C. such that the temperature of the wafer W may be controlled to be less than or equal to −35° C., and the silicon oxide film 200 is etched at a high etch rate under such extremely low temperature environment. The wafer W may be a silicon wafer, for example. The mask film 180 is preferably made of polysilicon or tungsten (W) but may also be an organic film, an amorphous carbon film, or a titanium nitride film, for example.

In the following, example etching results that were obtained when a polysilicon film was used as the mask film 180 are described.

<Process Conditions 1 (FIG. 2)>

| Chiller Temperature | −60° C. |
|---|---|
| Gas | Hydrogen ($H_2$)/Carbon Tetrafluoride ($CF_4$) |
| Gas Flow Rate | $H_2$ Varied/$CF_4$ Constant |
| First High Frequency Power HF | 2500 W, Continuous Wave |
| Second High Frequency Power LF | 4000 W, Pulse Wave (Frequency: 5 kHz), Duty Cycle: 50% (Effective Value of Second High Frequency Power LF: 2000 W) |

Under the above process conditions 1, a plasma was generated from $H_2$ gas and $CF_4$ gas, and the generated plasma was used to etch the silicon oxide film 200 via the mask film 180 and the silicon nitride film 190. In this process, the flow rate of $CF_4$ gas was controlled to be constant, and the flow rate of $H_2$ gas was controlled to be 0 sccm in (a) of FIG. 2, 50 sccm in (b) of FIG. 2, 100 sccm in (c) of FIG. 2, 150 sccm in (d) of FIG. 2, and 300 sccm in (e) of FIG. 2.

Figure 2:
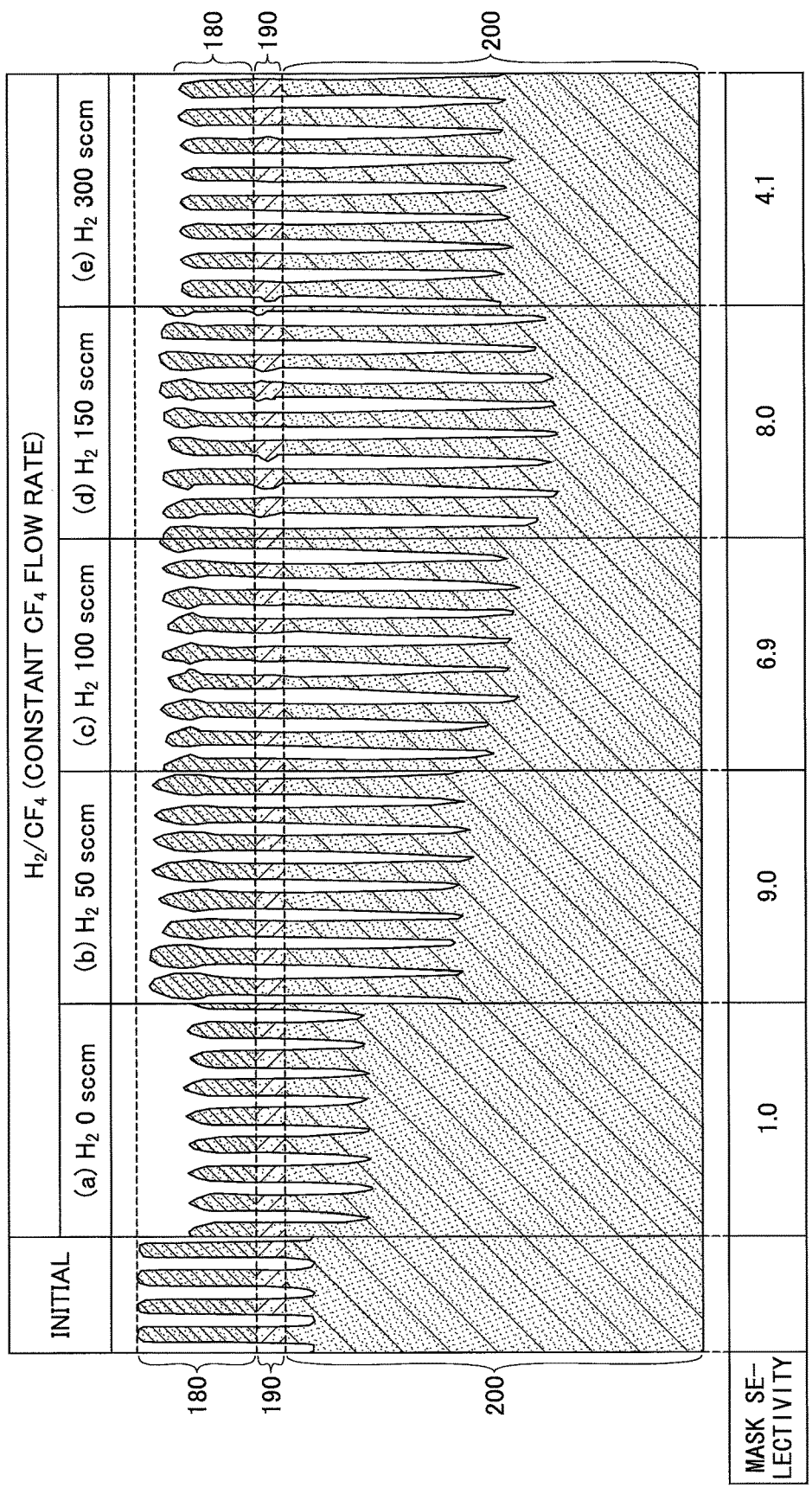
FIG. 2 is a diagram showing example etching results of etching a silicon oxide film using $H_2$ gas and $CF_4$ gas.
Figure 4:
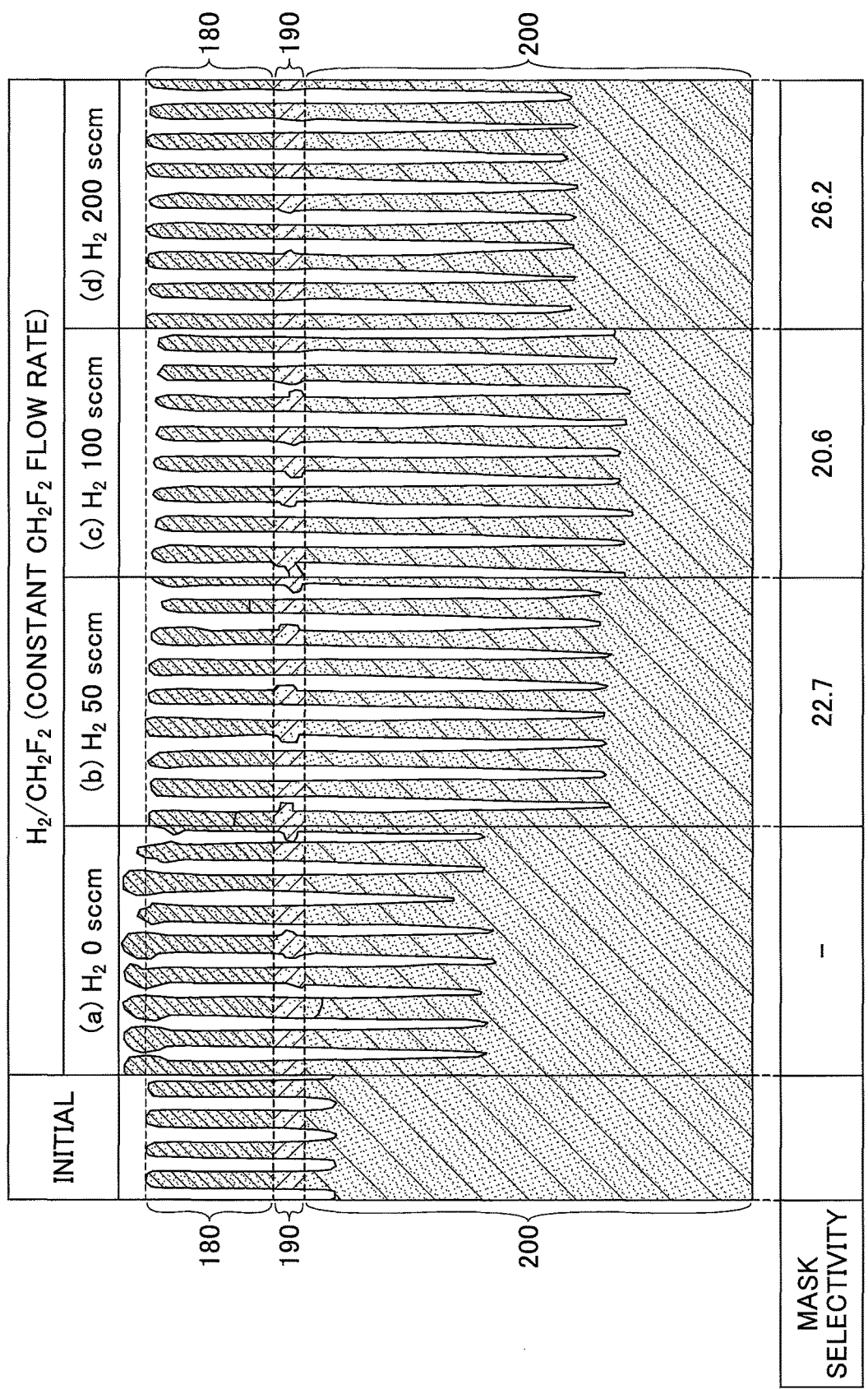
FIG. 4 is a diagram showing example etching results of etching the silicon oxide film using $H_2$ gas and $CH_2F_2$ gas according to an embodiment of the present invention.

As a result, the mask selectivity (etch rate of silicon oxide film 200/etch rate of mask film 180) was 1.0 in (a) of FIG. 2, 9.0 in (b) of FIG. 2, 6.9 in (c) of FIG. 2, 8.0 in (d) of FIG. 2, and 4.1 in (e) of FIG. 2. It can be appreciated from these results that higher mask selectivity can be achieved by including a hydrogen-containing gas, such as $H_2$ gas, in a fluorine-containing gas as compared with the case of not including a hydrogen-containing gas in the fluorine-containing gas.

<Process Conditions 2 (FIG. 3)>

| Chiller Temperature | −60° C. |
|---|---|
| Gas | Hydrogen ($H_2$)/Fluoroform ($CHF_3$) |
| Gas Flow Rate | $H_2$ Varied/$CHF_3$ Constant |
| First High Frequency Power HF | 2500 W, Continuous Wave |
| Second High Frequency Power LF | 4000 W, Pulse Wave (Frequency: 5 kHz), Duty Cycle: 50% (Effective Value of Second High Frequency Power LF: 2000 W) |

Under the above process conditions 2, a plasma was generated from $H_2$ gas and $CHF_3$ gas, and the generated plasma was used to etch the silicon oxide film 200 via the mask film 180 and the silicon nitride film 190. In this process, the flow rate of $CHF_3$ gas was controlled to be 0 sccm in (a) of FIG. 3, 25 sccm in (b) of FIG. 3, 50 sccm in (c) of FIG. 3, and 100 sccm in (d) of FIG. 3.

Figure 3:
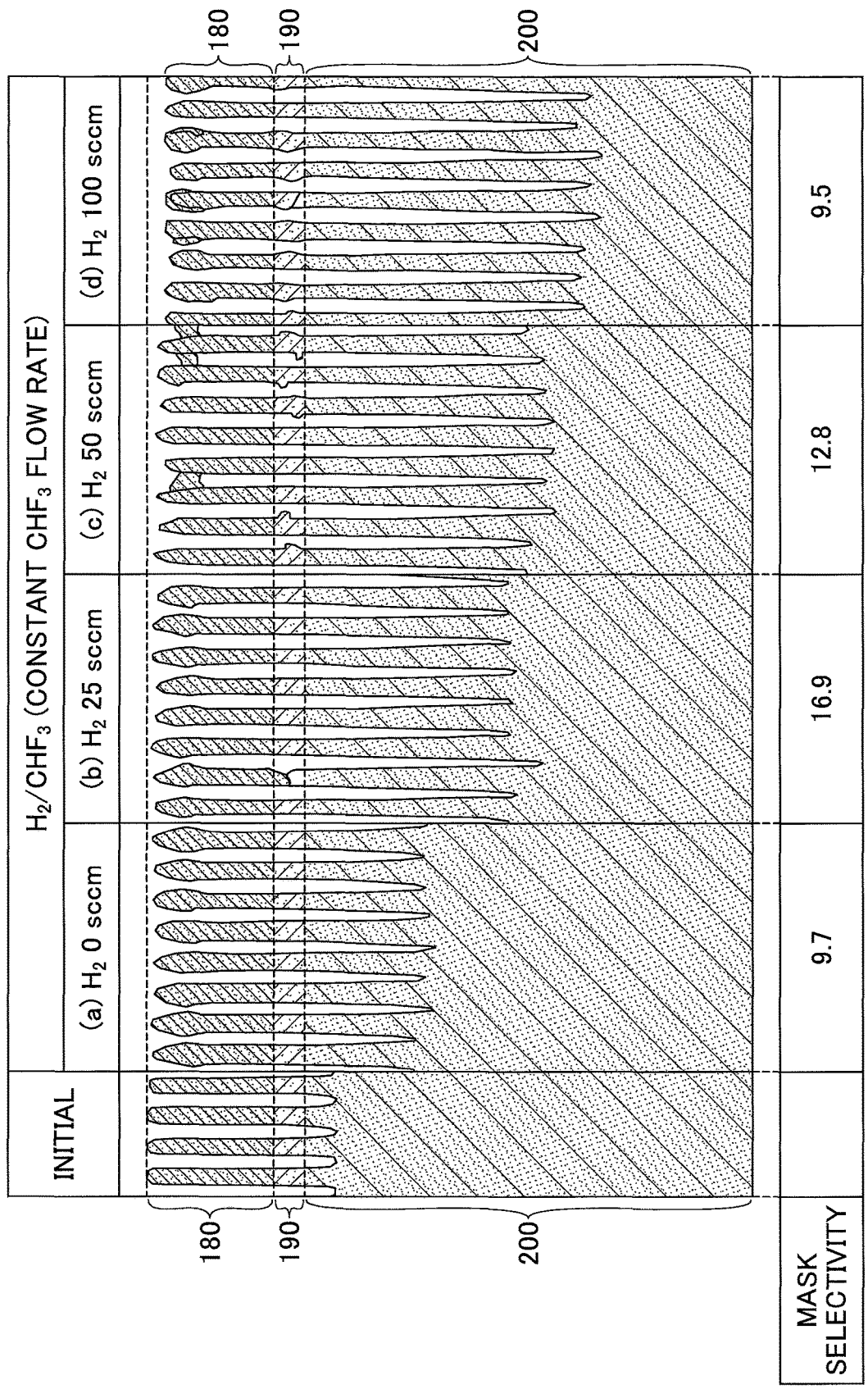
FIG. 3 is a diagram showing example etching results of etching the silicon oxide film using $H_2$ gas and $CHF_3$ gas according to an embodiment of the present invention.

As a result, the mask selectivity was 9.7 in (a) of FIG. 3, 16.9 in (b) of FIG. 3, 12.8 in (c) of FIG. 3, and 9.5 in (d) of FIG. 3. It can be appreciated from these results that the amount of reaction products deposited on the mask film 180 increases and the mask selectivity increases when the etching gas is switched from a combination of $H_2$ gas and $CF_4$ gas to a combination of $H_2$ gas and $CHF_3$ gas.

<Process Conditions 3 (FIG. 4)>

| Chiller Temperature | −60° C. |
|---|---|
| Gas | Hydrogen ($H_2$)/Difluoromethane ($CH_2F_2$) |
| Gas Flow Rate | $H_2$ Varied/$CH_2F_2$ Constant |
| First High Frequency Power HF | 2500 W, Continuous Wave |
| Second High Frequency Power LF | 4000 W, Pulse Wave (Frequency: 5 kHz), Duty Cycle: 50% (Effective Value of Second High Frequency Power LF: 2000 W) |

Under the above process conditions 3, a plasma was generated from $H_2$ gas and $CH_2F_2$ gas, and the generated plasma was used to etch the silicon oxide film 200 via the mask film 180 and the silicon nitride film 190. In this process, the flow rate of $CH_2F_2$ gas was controlled to be constant, and the flow rate of $H_2$ gas was controlled to be 0 sccm in (a) of FIG. 4, 50 sccm in (b) of FIG. 4, 100 sccm in (c) of FIG. 4, and 200 sccm in (d) of FIG. 4.

As a result, the mask film 180 was not etched in (a) of FIG. 4, thereby making the mask selectivity infinite. Also, the mask selectivity was 22.7 in (b) of FIG. 4, 20.6 in (c) of FIG. 4, and 26.2 in (d) of FIG. 4. It can be appreciated from these results that the mask selectivity upon etching the silicon oxide film 200 can be increased by switching the etching gas from a combination of $H_2$ gas and $CF_4$ gas to a combination of $H_2$ gas and $CH_2F_2$ gas.

<Process Conditions 4 (FIG. 5)>

| Chiller Temperature | −60° C. |
|---|---|
| Gas | Hydrogen ($H_2$)/Monofluoromethane ($CH_3F$) |
| Gas Flow Rate | $H_2$ Varied/$CH_3F$ Constant |
| First High Frequency Power HF | 2500 W, Continuous Wave |
| Second High Frequency Power LF | 4000 W, Pulse Wave (Frequency: 5 kHz), Duty Cycle: 50% (Effective Value of Second High Frequency Power LF: 2000 W) |

Under the above process conditions 4, a plasma was generated from $H_2$ gas and $CH_3F$ gas, and the generated plasma was used to etch the silicon oxide film 200 via the mask film 180 and the silicon nitride film 190. In this process, the flow rate of $CH_3F$ gas was controlled to be constant, and the flow rate of $H_2$ gas was controlled to 0 sccm in (a) of FIG. 5, 25 sccm in (b) of FIG. 5, 50 sccm in (c) of FIG. 5 (c), and 100 sccm in (d) of FIG. 5.

As a result, the mask selectivity was 18.0 in (a) of FIG. 5, 13.7 in (b) of FIG. 5, 12.9 in (c) of FIG. 5, and 21.8 in (d) of FIG. 5. It can be appreciated from these results that the mask selectivity upon etching the silicon oxide film 200 can be increased by switching the etching gas from a combination of $H_2$ gas and $CF_4$ gas to a combination of $H_2$ gas and $CH_3F$ gas.

Based on the above, when polysilicon is used as the mask film 180, the mask selectivity upon performing etching can be increased by adding at least one of $CHF_3$ gas, $CH_2F_2$ gas, and $CH_3F$ gas to an etching gas including a hydrogen-containing gas and a fluorine-containing gas as compared to the case of supplying only $H_2$ gas and $CF_4$ gas. For example, by adding at least one of $CHF_3$ gas, $CH_2F_2$ gas, and $CH_3F$ gas to an etching gas including $H_2$ gas and $CF_4$ gas, the mask selectivity can be increased to at least 5, and more preferably to at least 9.

Further, in an etching method according to one embodiment, $H_2$ gas may be supplied as an example of a hydrogen-containing gas, and $CF_4$ gas may be supplied as an example of a fluorine-containing gas. Also, $H_2O$ is produced as a reaction product as a result of the silicon oxide film 200 being etched by the $H_2$ gas contained in the etching gas. According to a general vapor pressure curve, $H_2O$ has a relatively low saturated vapor pressure. Note that liquid and vapor can coexist along the vapor pressure curve. Accordingly, when the temperature of the chiller is set to an extremely low temperature of about −60° C., $H_2O$ on the surface of the silicon oxide film 200 may presumably be saturated to some extent and exist in the form of liquid. The liquid existing on the surface of the silicon oxide film 200 as reaction products also include HF-based radicals produced by a reaction from $CF_4$ gas. As a result, hydrofluoric acid (HF) is generated by the HF-based radicals and $H_2O$ (water). In this way, etching may be promoted mainly by a chemical reaction resulting from the hydrofluoric acid (HF) being dissolved in water at the surface of the silicon oxide film 200, and the etch rate may be substantially increased as a result. Thus, in the etching method according to the present embodiment, etching of the silicon oxide film 200 may not be substantially hampered even when at least one of $CHF_3$ gas, $CH_2F_2$ gas, and $CH_3F$ gas is added to an etching gas including $H_2$ gas and $CF_4$ gas. That is, in the etching method according to an embodiment of the present invention, etching of the silicon oxide film 200 is promoted by actions of liquid hydrofluoric acid existing on the surface of the silicon oxide film 200 under a low temperature environment in which the temperature of the wafer W is controlled to be less than or equal to −35° C., and in this way, a high etch rate may be maintained.

Note that according to the above process conditions 1-4, the second high frequency power LF is output in the form of a pulse wave. In the following, the on-time of the second high frequency power LF is referred to as "Ton", and the off-time of the second high frequency power LF is referred to as "Toff". In this case, a pulse wave of the second high frequency power LF with a frequency of 1/(Ton+Toff) is applied. Also, the duty cycle of the second high frequency power LF, corresponding to the ratio of the on-time Ton with to the total time of the on-time Ton and the off-time Toff, may be expressed as Ton/(Ton+Toff).

According to the above etching results, by outputting the second high frequency power LF as a pulse wave, heat input from plasma may be suppressed during the off-time Toff of the second high frequency power LF, and in this way, a temperature increase in the wafer W may be prevented to thereby improve temperature controllability. As a result, the temperature of the wafer W may be controlled to be less than or equal to −35° C., and the silicon oxide film 200 may be etched at a high etch rate in a low temperature environment.

Note that in some embodiments, not only the second high frequency power LF but also the first high frequency power HF may be output as a pulse wave, for example. Also, in some embodiments, the second high frequency power LF may not be applied during the etching process, and only the first high frequency power HF may be applied, for example. In the case where the second high frequency power LF is not applied, the high frequency power for biasing is turned off such that the deposition of reaction products on the mask film 180 upon etching the silicon oxide film 200 can be promoted.

[Etching Results when Using Tungsten as Mask Film]

In the following, example etching results that were obtained in a case where tungsten (W) was used in place of polysilicon as the mask layer 180 are described. In the present embodiment, a tungsten (W) blanket ("W blanket") and the silicon oxide film 200 were etched.

Figure 6A:
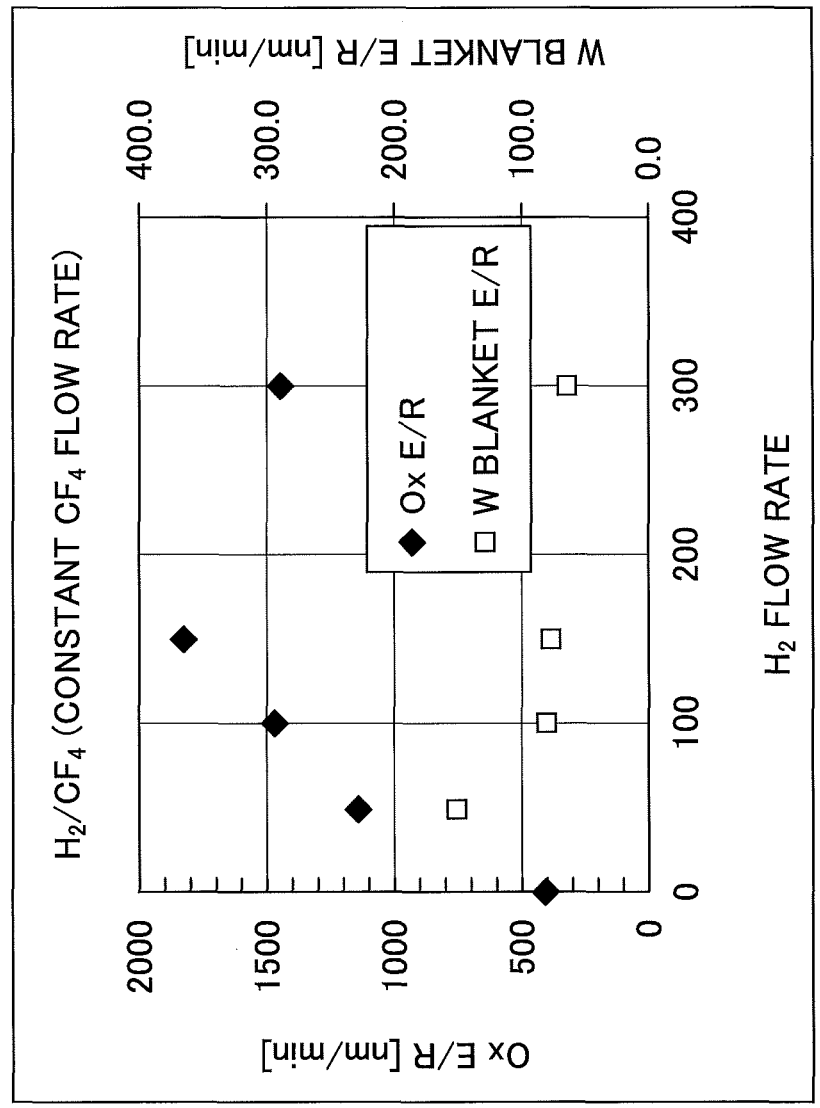

FIGS. 6A and 6B are graphs indicating the etch rate of the silicon oxide film 200 ("Ox E/R") on the vertical axis on the left side and the etch rate of the W blanket ("W Blanket E/R") on the vertical axis on the right side. The horizontal axis of FIG. 6A represent the flow rate of $H_2$ gas in a case where the flow rate of $CF_4$ gas is controlled to be constant and the flow rate of $H_2$ gas is controlled to vary. The horizontal axis of FIG. 6B represent the flow rate of $H_2$ gas in a case where the flow rate of $CH_2F_2$ gas is controlled to be constant and the flow rate of $H_2$ gas is controlled to vary. Process conditions other than those related to the etching gas were as follows.

| | |
|---|---|
| Chiller Temperature | −60° C. |
| First High Frequency Power HF | 2500 W, Continuous Wave |
| Second High Frequency Power LF | 4000 W, Pulse Wave (Frequency: 5 kHz), Duty Cycle: 50% (Effective Value of Second High Frequency Power LF: 2000 W) |

By referring to the etching results of FIGS. 6A and 6B, it can be appreciated that the etch rate of the silicon oxide film 200 is sufficiently low relative to the etch rate of the tungsten (W) blanket regardless of whether $CF_4$ gas is used or $CH_2F_2$ gas is used, and regardless of the flow rate of $H_2$ gas. Also, as can be appreciated from the etching results of FIG. 6B, a high mask selectivity (at least 10) can be achieved by using a gas including $H_2$ gas and $CH_2F_2$ gas as an etching gas and using tungsten (W) as the mask film 180.

[Profile Control of Opening in Silicon Oxide Film]

In the following, profile control of the opening formed in the silicon oxide film 200 using a hydrofluorocarbon gas is described with reference to FIGS. 7A-7D. FIG. 7A illustrates an initial state of the silicon oxide film 200. Note that there is no mask film arranged on top of the silicon oxide film 200 in FIG. 7A. The silicon oxide film 200 has a hole formed therein. In the present example, etching was performed under the following process conditions.

Figure 7B:
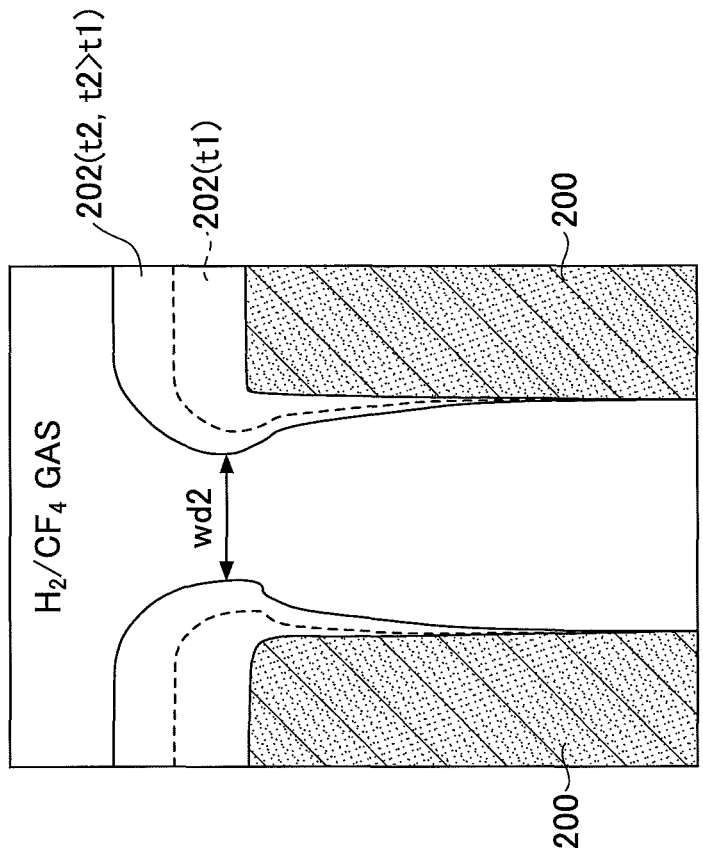
FIGS. 7A-7D are diagrams showing example profiles of an opening formed by an etching method according to an embodiment of the present invention.
Figure 7A:
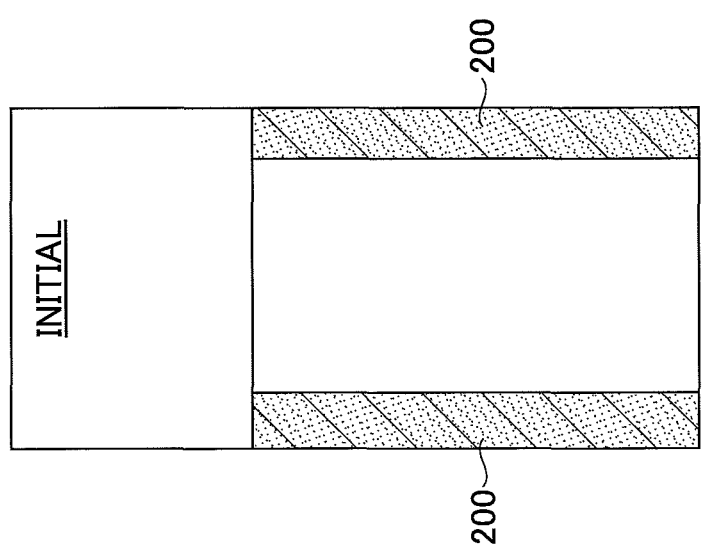
Figure 7D:
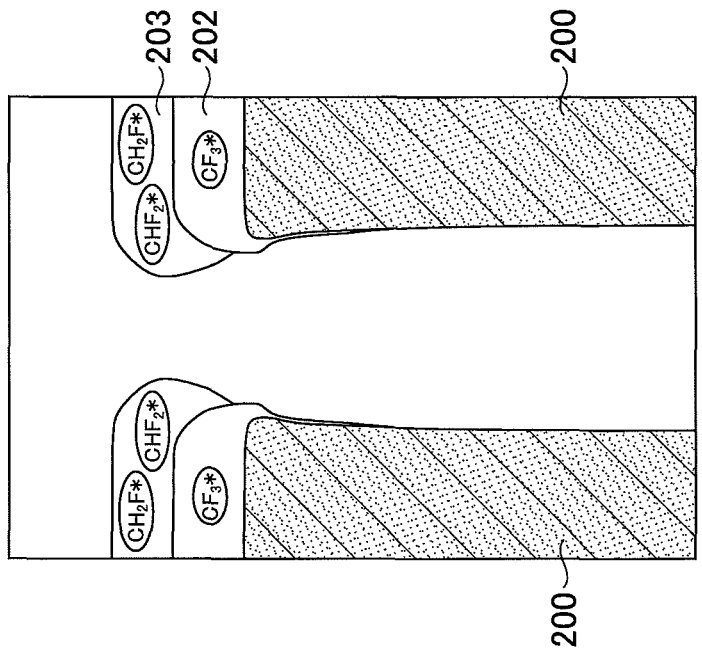

| | |
|---|---|
| Gas | FIG. 7B: $H_2/CF_4$ |
| | FIG. 7C: $H_2/CH_2F_2$ |
| First High Frequency Power HF | 2500 W, Continuous Wave |
| Second High Frequency Power LF | Not Applied |

Figure 7C:
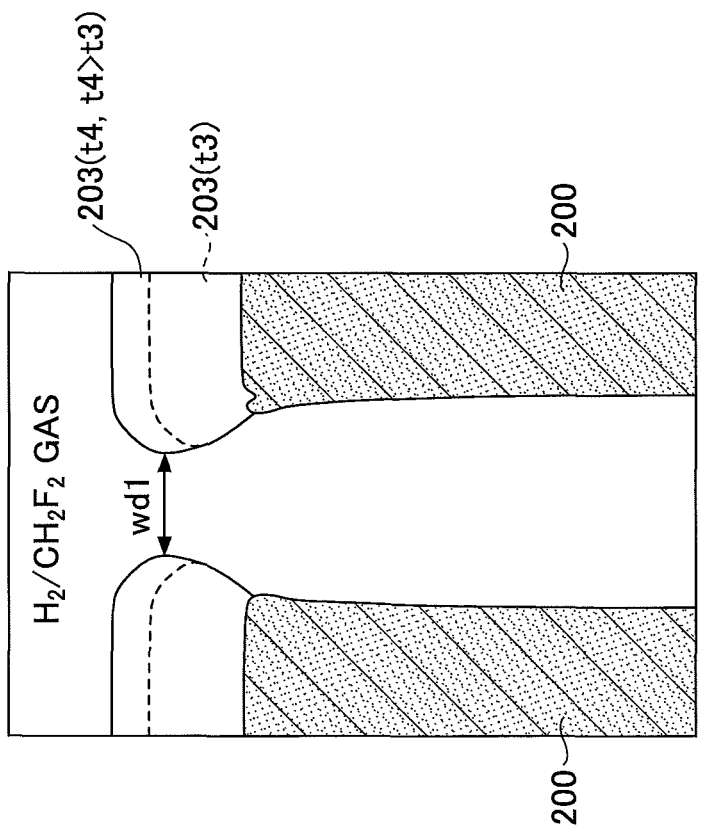

It can be appreciated from FIGS. 7B and 7C that reaction products are gradually deposited on the silicon oxide film 200 by performing etching under the above process conditions. In FIG. 7B, reaction products 202 are deposited on the silicon oxide film 200 to a certain height after time t1, and reaction products 202 are further deposited on the deposited reaction products 202 after time t2 (t2>t1).

Similarly, in FIG. 7C, reaction products 203 are deposited on the silicon oxide film 200 to a certain height after time t3, and reaction products 203 are further deposited on the deposited reaction products 203 after time t4 (t4>t3, t4<t2). Also, it can be appreciated that the profile of the reaction products 202 shown in FIG. 7B and the profile of the reaction products 203 shown in FIG. 7C are different. Specifically, the narrowest portion (wd1) of the hole formed in the reaction product 203 is positioned higher relative to the position of the narrowest portion (wd2) of the hole formed in the reaction products 202. That is, the reaction products 203 tend to be deposited towards the top side of the hole as compared with the reaction products 202.

Further, note that although FIG. 7B and FIG. 7C are cross-sections of the reaction products 202 and the reaction products 203 when they have been deposited up to the same height, the deposition rate of the reaction products 203 is higher than the deposition rate of the reaction products 202.

The reaction products 202 are formed by the deposition of $CF_3$ radicals ($CF_3^*$) within the plasma generated from the $CF_4$ gas of the etching gas including $H_2$ gas and $CF_4$ gas supplied to the processing chamber 10. On the other hand, the reaction products 203 are formed by the deposition of $CH_2F$ radicals ($CH_2F^*$) and $CHF_2$ radicals ($CHF_2^*$) within the plasma generated from the $CH_2F_2$ gas of the etching gas including $H_2$ gas and $CH_2F_2$ gas supplied to the processing chamber 10.

Note that the sticking coefficient of $CF_3$ radicals is lower than the sticking coefficients of $CH_2F$ radicals and $CHF_2$ radicals. Thus, the $CF_3$ radicals with the lower sticking coefficient are more likely to travel deeper into the hole before sticking to a side wall face of the hole, for example. On the other hand, the $CH_2F$ radicals and the $CHF_2$ radicals with higher sticking coefficients are more likely to stick to a side wall face toward the opening of the hole (towards the top side of the hole) or on top of the deposited reaction products, for example. As a result, the reaction products 202 are more easily deposited on a side wall face towards the deeper side of the opening of the hole as compared with the reaction products 203, and the reaction products 203 are more easily deposited on a side wall face near the opening (top side) of the hole or on top of the deposited reaction products as compared with the reaction products 202.

Also, because the sticking coefficients of $CH_2F$ radicals and $CHF_2$ radicals are higher than the sticking coefficient of $CF_3$ radicals, the deposition rate of the reaction products 203 is higher than the deposition rate of the reaction products 202. As a result, higher mask selectivity can be achieved when the reaction products 203 are generated by supplying the etching gas including $H_2$ gas and $CH_2F_2$ gas as compared with the case where the reaction products 202 are generated by supplying the etching gas including $H_2$ gas and $CF_4$ gas. Additionally, the reaction products 203 that are generated upon supplying the etching gas including $H_2$ gas and $CH_2F_2$ gas are more easily deposited near the opening (top side) of the hole and on top of deposited reaction products as compared with the reaction products 202 that are generated upon supplying the etching gas including $H_2$ gas and $CF_4$ gas. Therefore, the profile of the hole formed in the deposited reaction products 203 may be more easily controlled to have a substantially vertical configuration as compared with the case of controlling the profile of the hole formed in the deposited reaction products 202 (see FIG. 7D).

Based on the above, in an etching method according to an embodiment of the present invention, a plasma may be generated from $H_2$ gas, $CF_4$ gas, and $CH_2F_2$ gas using the first high frequency power HF for plasma generation, and the generated plasma may be used to etch the silicon oxide film 200. In this case, radicals generated from the $CH_2F_2$ gas has a higher sticking coefficient as compared with the sticking coefficient of the radicals generated from the $CF_4$ gas. Thus, the profile of the reaction products 203 deposited on the mask film 180 may be controlled by controlling the flow rates of the $CF_4$ gas and the $CH_2F_2$ gas, for example. In this way, fine adjustments may be made to the profile of the opening forming in the mask film 180 while performing plasma etching to thereby control the hole etched in the silicon oxide film 200 to have a more vertical configuration, for example.

[Types of Hydrofluorocarbon Gas]

In etching methods according to embodiments of the present invention, the gas supplied along with $H_2$ gas and $CF_4$ gas is not limited to $CH_2F_2$ gas and may be some other type of hydrofluorocarbon gas. Note, however, that the sticking coefficient of radicals generated from the hydrofluorocarbon gas has to be higher than the sticking coefficient of radicals generated from the fluorine-containing gas.

For example, in an etching method according to one embodiment, at least three types of gases are used, including $H_2$ gas and $CF_4$ gas, and a hydrofluorocarbon gas, which may be at least one of $CH_2F_2$ gas, $CH_3F$ gas, and $CHF_3$ gas, for example. In some embodiments, two or more types of hydrofluorocarbon gases may be added to the $H_2$ gas and $CF_4$ gas, for example. In such case, further fine adjustments may be made to the profile of the reaction products 203 deposited on the mask film 180 by controlling the respective flow rates of the plurality of types of hydrofluorocarbon gases added to the $H_2$ gas and $CF_4$ gas, for example.

Also, in an etching method according to one embodiment of the present invention, a step of performing plasma etching by supplying $H_2$ gas and $CF_4$ gas, and a step of performing plasma etching by supplying $H_2$ gas, $CF_4$ gas, and a hydrofluorocarbon gas may be alternately executed.

[Etching Results]

FIGS. 8A-8D illustrate etching results obtained by implementing etching methods according to embodiments of the present invention under the above process conditions using different types of hydrofluorocarbon gases and different flow rates as indicated below. Note that in FIGS. 8A-8D, the etching gases were supplied for the requisite time (i.e., 96 sec, 60 sec, 39 sec, and 30 sec) such that reaction products would be deposited up to the same height.

FIG. 8A: $H_2/CF_4$=150 sccm/100 sccm
FIG. 8B: $H_2/CHF_3$=100 sccm/100 sccm
FIG. 8C: $H_2/CH_2F_2$=100 sccm/100 sccm
FIG. 8D: $H_2/CH_3F$=0 sccm/100 sccm As shown in FIGS. 8A-8D, reaction products 202, 204, 203, and 205 were respectively deposited on the silicon oxide film 200 by performing etching while maintaining the temperature of the wafer W to a low temperature less than or equal to −35° C. It can be appreciated from these results that the reaction products 203-205 that are generated upon performing etching using a gas including H2 gas and at least one type of hydrofluorocarbon gas ($CH_2F_2$ gas, $CH_3F$ gas, or $CHF_3$ gas) are more likely to be deposited on the top side of the opening formed in the reaction products as compared with the reaction products 202 that are generated upon performing etching using a gas containing H2 gas and $CF_4$ gas. That is, the reaction products 203-205 are less likely to be deposited on a side wall face of the opening, and as such, the profile of the opening can be controlled to have a more vertical configuration.

Also, with respect to the deposition rate, the highest deposition rate was achieved in FIG. 8D where the etching gas $H_2/CH_3F$ was supplied at 0/100 sccm, followed by FIG. 8C where the etching gas $H_2/CH_2F_2$ was supplied at 100/100 sccm, and then FIG. 8B where the etching gas $H_2/CHF_3$ was supplied at 100/100 sccm. It can be appreciated from the above that the deposition rate becomes higher as the number x of H atoms in the hydrofluorocarbon gas $CH_xF_y$ increases, and the mask selectivity also increases in this case.

As described above, according to an aspect of an etching method of the present embodiment, by adding to the etching gas including $H_2$ gas and $CF_4$ gas, a hydrofluorocarbon gas that generates radicals with a sticking coefficient that is higher than the sticking coefficient of radicals generated from a fluorine-containing gas, etching can be performed while adjusting the profile of an opening formed in the mask film 180. In this way, the etching profile of the silicon oxide film 200 arranged under the mask film 180 may be controlled to have a more vertical configuration.

Note that $CF_4$ gas is an example of a first fluorine-containing gas. Hydrofluorocarbon gas is an example of a second fluorine-containing gas. The second fluorine-containing gas may be at least one of difluoromethane ($CH_2F_2$) gas, monofluoromethane ($CH_3F$) gas, and fluoroform ($CHF_3$) gas, for example.

Although an etching method according to the present invention have been described above with respect to certain illustrative embodiments, the etching method according to the present invention is not limited to the above embodiments, and various modifications and improvements may be made within the scope of the present invention. Also, features of the embodiments described above may be combined to the extent practicable.

For example, the etching method according to the present invention is not limited to being applied to a capacitively coupled plasma (CCP) etching apparatus as represented by the etching apparatus 1 but may also be implemented in other various types of plasma processing apparatuses. Examples of other types of plasma processing apparatuses include an inductively coupled plasma (ICP) processing apparatus, a plasma processing apparatus using a radial line slot antenna, a helicon wave plasma (HWP) processing apparatus, an electron cyclotron resonance plasma (ECR) processing apparatus, and the like.

Also, although a semiconductor wafer W is described above as an example object to be etched, the etching method according to the present invention may also be implemented on a substrate used in a liquid crystal display (LCD) or a flat panel display (FPD), a photomask, a CD substrate, or a printed circuit board, for example.

What is claimed is:

1. An etching method for etching a silicon oxide film, the etching method comprising:
    generating a first plasma from a gas including hydrogen ($H_2$) gas, carbon tetrafluoride ($CF_4$) gas, and a hydrofluorocarbon-containing gas that includes at least one of difluoromethane ($CH_2F_2$) gas, monofluoromethane ($CH_3F$) gas, or fluoroform ($CHF_3$) gas using a first high frequency power;
    etching the silicon oxide film using the generated first plasma;
    generating a second plasma from a gas consisting of hydrogen ($H_2$) gas and carbon tetrafluoride ($CF_4$) gas using a second high frequency power; and
    etching the silicon oxide film using the generated second plasma, wherein
        the etching with the first plasma is performed in a low temperature environment in which a temperature of a wafer is less than or equal to −35° C.,
        the silicon oxide film is alternately etched with the first plasma and the second plasma,
        reaction products generated from the carbon tetrafluoride ($CF_4$) and reaction products generated from the hydrofluorocarbon-containing gas are deposited on a side wall face of a hole, the reaction products generated from the carbon tetrafluoride ($CF_4$) being deposited at a greater depth within the hole than the reaction products generated from the hydrofluorocarbon-containing gas, and
        the reaction products generated from the hydrofluorocarbon-containing gas are deposited over the deposited reaction products generated from the carbon tetrafluoride ($CF_4$), to thereby adjust an opening size of the hole.

2. The etching method according to claim 1, wherein
    the silicon oxide film is etched via a mask film; and
    when the mask film comprises tungsten (W), a mask selectivity is greater than or equal to 10.

3. The etching method according to claim 1, wherein
    the silicon oxide film is etched via a mask film; and
    when the mask film comprises polysilicon, a mask selectivity is greater than or equal to 5.

4. The etching method according to claim 1, the method further comprising:
    controlling the respective flow rates of the hydrofluorocarbon-containing gas to adjust the profile of reaction products deposited on a mask, wherein
        the hydrofluorocarbon-containing gas includes two or more of difluoromethane ($CH_2F_2$) gas, monofluoromethane ($CH_3F$) gas, or fluoroform ($CHF_3$) gas.

5. The etching method according to claim 1, wherein the temperature of the wafer is approximately −35° C.

6. An etching method for etching a silicon-containing film through an opening in a mask, the method comprising:
    generating a plasma from a gas including hydrogen ($H_2$) gas, carbon tetrafluoride ($CF_4$) gas, and a hydrofluorocarbon-containing gas that includes difluoromethane ($CH_2F_2$) gas, monofluoromethane ($CH_3F$) gas, or fluoroform ($CHF_3$) gas using a high frequency power;
    adjusting a profile of the opening in the mask, by controlling a flow rate of the $CF_4$ gas and of the hydrofluorocarbon-containing gas, to control position where reaction product is deposited; and
    etching the silicon-containing film using the plasma through the opening in the mask, wherein
        reaction products generated from the carbon tetrafluoride ($CF_4$) and reaction products generated from the hydrofluorocarbon-containing gas are deposited on a side wall face of the opening, the reaction products generated from the carbon tetrafluoride ($CF_4$) being deposited at a greater depth within the opening than the reaction products generated from the hydrofluorocarbon-containing gas, and
        the reaction products generated from the hydrofluorocarbon-containing gas are deposited over the deposited reaction products generated from the carbon tetrafluoride ($CF_4$), to thereby adjust dimensions of the opening.

7. The etching method of claim 6, wherein
    the etching with the plasma is performed on a wafer having a temperature of less than or equal to −35° C.

8. The etching method of claim 7, wherein
    the silicon-containing film is a silicon oxide film.

9. The etching method of claim 6, wherein
    the mask includes polysilicon or tungsten.

10. The etching method of claim 6, wherein
    the generating of the plasma, the adjusting of the profile of the opening, and the etching of the silicon-containing film are performed simultaneously.

11. The etching method of claim 6, wherein a mask selectivity is greater than or equals to 10.

12. The etching method of claim 6, wherein the profile of the opening in the mask is adjusted by narrowing the opening.

13. The etching method of claim 7, wherein the first high frequency power is applied to the mounting table in generating the first plasma, a second frequency of the second high frequency power is a lower frequency than a first frequency of the first high frequency power, and the second high frequency power is output in the form of a pulse wave.

14. The etching method of claim 13, wherein the first high frequency power is output in the form of a pulse wave.

15. The etching method of claim 13, wherein the first high frequency power is output in the form of a continuous wave.

\* \* \* \* \*